United States Patent [19]
Yasumura

[11] 4,451,796
[45] May 29, 1984

[54] VOLUME CONTROL APPARATUS

[75] Inventor: Satoshi Yasumura, Tokyo, Japan
[73] Assignee: Trio Kabushiki Kaisha, Tokyo, Japan
[21] Appl. No.: 300,458
[22] Filed: Sep. 8, 1981

[30] Foreign Application Priority Data

Sep. 8, 1980 [JP] Japan .......................... 55-127427[U]

[51] Int. Cl.³ ........................ H03G 3/20; H03F 21/00
[52] U.S. Cl. .................................... 330/127; 330/298
[58] Field of Search .................... 330/127, 129, 207 P, 330/298

[56] References Cited

U.S. PATENT DOCUMENTS 4,101,840 7/1978 Fricke et al. ........................ 330/127

Primary Examiner—James B. Mullins
Assistant Examiner—G. Wan
Attorney, Agent, or Firm—Gerald J. Ferguson, Jr.; Joseph J. Baker

[57] ABSTRACT

A volume control apparatus for use in an acoustic apparatus with a sound signal source and an amplifier which is usable as an alarm or warning apparatus. The volume control apparatus is provided with a motor for operating a volume control variable resistor, a manually operatable presetting variable resistor and first, second and third selectively operable manual switching means. Upon each power supply, the volume control variable resistor is always automatically set by the motor to a position corresponding to a preset position of the presetting variable resistor regardless of its position prior to the power supply.

By selectively operating the first and second switching means at a desired moment after the power supply, the volume control variable resistor is set by the motor from the position corresponding to the preset position of the presetting variable resistor to a desired position regardless of its previous position.

By operating the third switching means at a desired moment after the power supply, the presetting variable resistor can be adjusted while listening to a sound produced by a speaker.

4 Claims, 3 Drawing Figures

VOLUME CONTROL APPARATUS

BACKGROUND OF THE INVENTION

1. Field of the Invention

The present invention relates to a volume control apparatus which is suitable for use in acoustic apparatus provided with a sound signal source, such as a tuner of a radio or television receiver, tape recorder, disc player or the like, and an amplifier for amplifying a sound signal from the sound signal source for input to a speaker.

2. Description of the Prior Art

The abovesaid type of acoustic apparatus could be used as an alarm or warning apparatus when combined with a timer having a switch which makes at a preset time. In such a case, the timer is preset so that a power supply to the acoustic apparatus via the switch may start at a desired time. Upon making the switch of the timer at the preset time, power is supplied to the acoustic apparatus to put it in operation, by which a sound signal from the sound signal source is provided via the amplifier to the speaker to produce a sound, thus giving an alarm or warning.

The acoustic apparatus of this kind usually has, in its amplifier system, a volume control variable resistor for controlling the volume of the sound which is produced by the speaker.

The alarm or warning is given with a volume corresponding to the position where the volume control variable resistor is set when presetting the timer. The sound volume of the alarm should be neither too large nor too small.

The conventional acoustic apparatus with the volume control variable resistor is usually arranged so that the variable resistor may manually be set to an arbitrary value. In the case of employing such an acoustic apparatus as an alarm or warning apparatus, it is necessary that when setting timer, the volume control variable resistor be manually preset at such a position that a sound of a volume suitable as an alarm or warning can be produced. However, such manual setting of the volume control variable resistor is very cumbersome. Furthermore, in the case where the volume control variable resistor has not been preset at the position where the volume suitable as an alarm or warning could be obtained, the volume of the sound ultimately produced is not always appropriate as the alarm or warning.

SUMMARY OF THE INVENTION

It is therefore an object of the present invention to provide a novel volume control apparatus suitable for use in acoustic apparatus with a sound signal source and an amplifier which can be employed as an alarm or warning apparatus.

Briefly stated, the volume control apparatus of the present invention is provided with a motor for operating a volume control variable resistor, a manually operable presetting variable resistor, and first and second selectively operable manual switching means.

According to the volume control apparatus of the present invention, the volume control resistor is automatically driven by the motor, upon each power supply, to a position corresponding to the preset position of the presetting variable resistor regardless of the position of the volume control resistor before the power supply. Accordingly, it is possible to obtain a sound of the loudness corresponding to the preset position of the presetting variable resistor for each power supply.

Therefore, when the acoustic apparatus employing the volume control apparatus of the present invention is used as an alarm or warning apparatus in combination with the aforesaid timer, there is no need of manually presetting the volume control variable resistor concurrently with the setting of the timer unlike in the aforementioned prior art acoustic apparatus, so long as the preset position of the presetting variable resistor is preadjuted. In other words, the present invention eliminates the necessity of the troublesome manual presetting of the volume control variable resistor when setting the timer and, in addition, the invention ensures to obtain a sound volume appropriate as an alarm or warning at all times.

Moreover, according to the volume control apparatus of the present invention, by selectively operating the first and second switching means after obtaining a sound of the loudness corresponding to the preset position of the presetting variable resistor, the volume control variable resistor can be brought by the motor to an arbitrary position from the position corresponding to the preset position of the presetting variable resistor. Accordingly, it is possible to obtain a sound of an arbitrary loudness after obtaining the sound of the loudness corresponding to the preset position of the presetting variable resistor.

Other objects, features and advantages of the present invention will become more fully apparent from the following detailed description taken in conjunction with the accompanying drawings.

DESCRIPTION OF THE PREFERRED EMBODIMENTS

Figure 1:
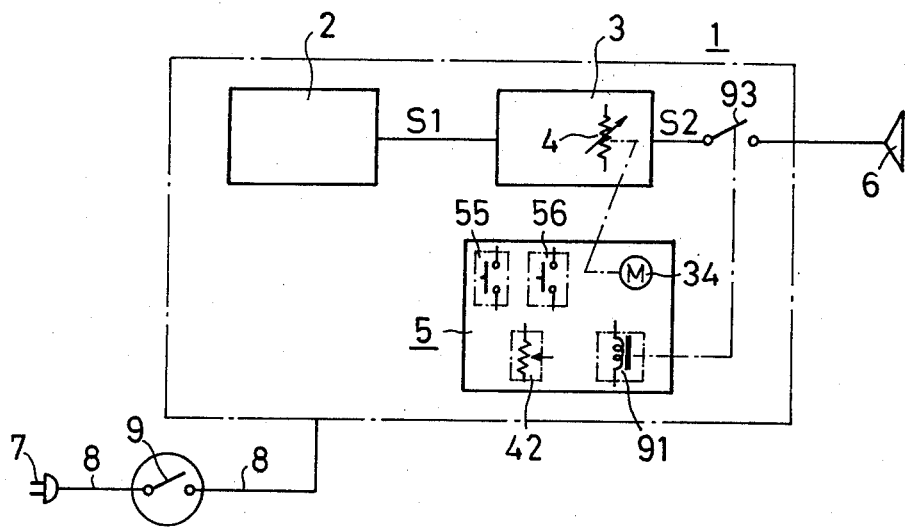
FIG. 1 is a block diagram schematically illustrating an acoustic apparatus with a sound signal source and an amplifier, which employs the volume control apparatus of the present invention.

In FIG. 1, reference numeral 1 indicates generally an acoustic apparatus, which is provided with a sound signal source 2, such as a tuner of a radio or television receiver, tape recorder, disc player or the like, and an amplifier 3 for amplifying a sound signal S1 from the sound signal source 2.

The amplifier 3 has a volume control variable resistor 4, as usual, which is operated by a motor 34 which is included in a volume control apparatus 5 of the present invention as will be described later. The volume control apparatus 5 is provided with a presetting variable resistor 42, first and second switching means 55 and 56 and a relay 91 in addition to the motor 34 as will be described later. An amplifier sound signal S2 from the amplifier 3 is supplied to a speaker 6 via a contact 93 of the relay 91 included in the volume control apparatus 5 as will be described later.

The acoustic apparatus 1 with the sound signal source 2, the amplifier 3 and the volume control apparatus 5 is made operative by power which is supplied via a power plug 7 and a power supply cord 8 connected with a plug socket of the commercial power source (not shown). In this case, a switch 9 of a known timer (not shown) is inserted in the power supply cord 8. Accordingly, upon making the switch 9 of the timer, the commercial power source is supplied to the acoustic apparatus 1 to activate it. In a predetermined period of time after starting the power supply to the acoustic apparatus 1, the volume control variable resistor 4 is set by the motor 34 to a position corresponding to the preset position of the presetting variable resistor 42 of the volume control apparatus 5. In this while, the contact 93 of the relay 91 does not make but, after the lapse of the abovesaid period of time, it makes. In consequence, from the moment of starting the power supply to the acoustic apparatus 1 the sound signal souce 2 yields the sound signal S1 and the amplifier 3 amplifies it to provide the amplified sound signal S2, which is, however, supplied to the speaker 6 after the lapse of the abovesaid period of time. The amplified sound signal S2 has an intensity corresponding to the preset position of the presetting variable resistor 42. Accordingly, after the lapse of the abovesaid period of time the speaker 6 produces a sound of the loudness corresponding to the preset position of the presetting variable resistor 42. Thereafter, by a selective activation of the first and second switching means 55 and 56, the volume control variable resistor 4 is set by the motor 34 to a desired position from a position corresponding to the preset position of the presetting variable resistor 42. As a result of this, a sound of a desired loudness can be produced by the speaker 6.

Figure 2:
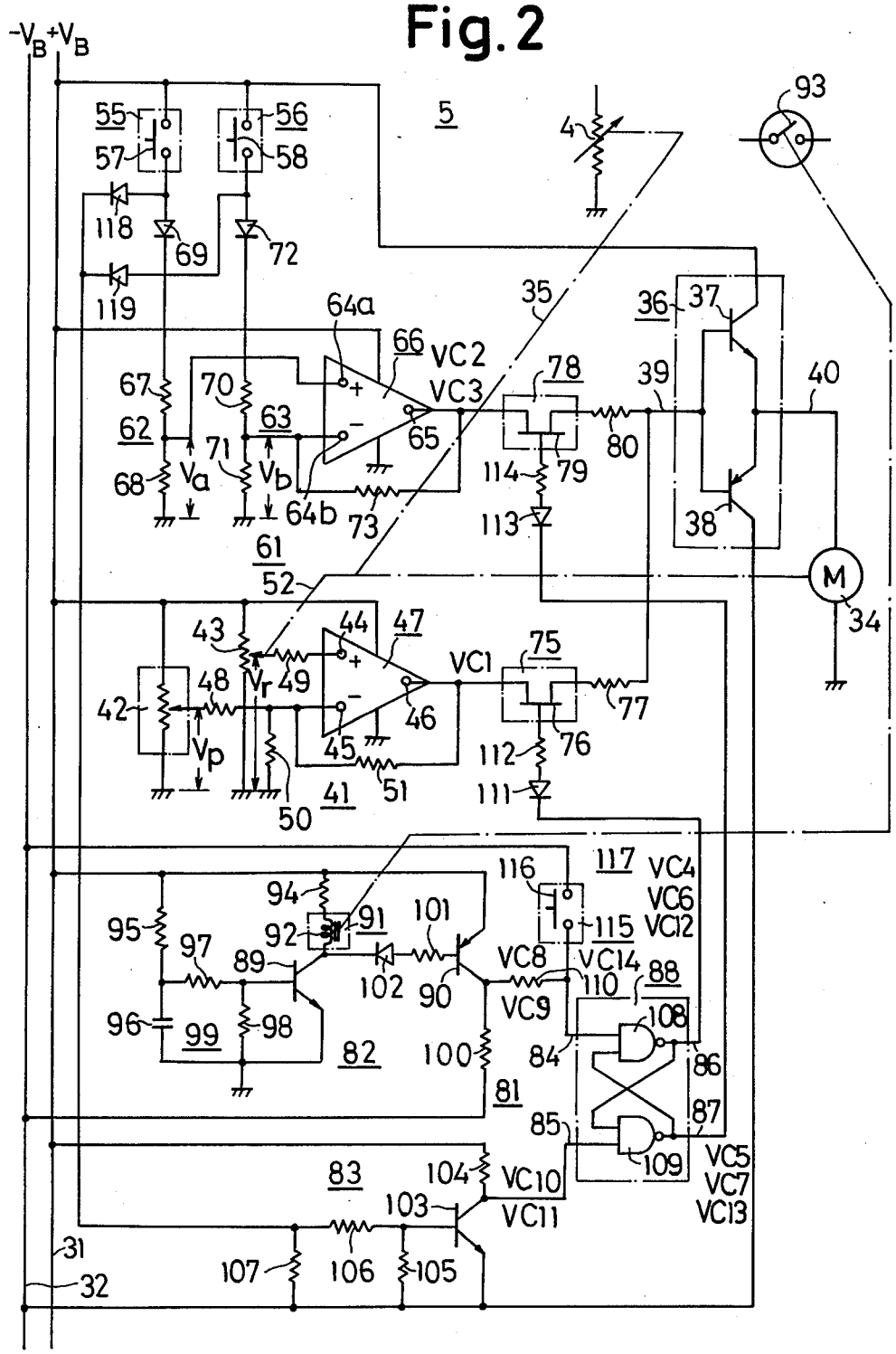
FIG. 2 is a connection diagram illustrating an embodiment of the volume control apparatus of the present invention.

FIG. 2 shows in detail a specific example of the volume control apparatus 5 of the present inention utilized in FIG. 1.

In FIG. 2 there are shown power supply lines 31 and 32. Between the power supply line 31 and the ground is developed a DC power of a +5 to +12 V positive voltage $+V_B$ by supplying the commercial power to the acoustic apparatus 1 via the timer switch 9 as described previously in connection with FIG. 1. Between the power supply line 32 and the ground is similarly produced a DC power of a −5 to −12 V negative voltage $-V_B$ by the power supply to the acoustic apparatus 1 via the timer switch 9.

The DC powers of such voltages $+V_B$ and $-V_B$ can be obtained from a power source circuit (not shown) which may be provided in the amplifier 3 of the acoustic apparatus 1 for receiving the commercial power supplied via the timer switch 9. The DC power available from the power source circuit can be utilized for the amplifier 3, of course, and it can also be employed for the sound source 2.

The volume control apparatus 5 has a motor 34 for operating the volume control variable resistor 4. The motor 34 has its shaft (not shown) coupled with a movable contact of the volume control variable resistor 4 via an appropriate coupling mechanism 35.

The volume control apparatus 5 is provided with a motor drive circuit 36 for driving the motor 34. The motor drive circuit 36 has, for example, a bipolar NPN type switching transistor 37 and a bipolar PNP type switching transistor 38, the bases of which are connected together to an input 39 and the emitters of which are connected together to an output 40. The output 40 is connected to one end of the motor 34, which is grounded at the other end. The collectors of the transistors 37 and 38 are connected to the power supply lines 31 and 32, respectively. When a positive control signal is applied to the input 39, the transistors 37 and 38 are turned ON and OFF, respectively, and the DC power of the voltage $+V_B$ occurring between the power supply line 31 and the ground is provided to the motor 34 via the transistor 37 and the output 40. When supplied with the DC power of the voltage $+V_B$, the motor 34 rotates in a forward direction to drive the volume control variable resistor 4 in a such a direction as to increase the loudness of the sound which is produced by the speaker 6. In the case where a negative control signal or zero-volt control signal is applied to the input 39, the transistors 37 and 38 are turned OFF and ON, respectively, and the power source of the voltage $-V_B$ occurring between the power supply line 32 and the ground is provided to the motor 34 via the transistor 38 and the output 40. When supplied with the DC power of the voltage $-V_B$, the motor 34 rotates in a backward direction to drive the volume control variable resistor 4 in such a direction as to decrease the loudness of the sound that is produced by the speaker 6.

The volume control apparatus 5 is provided with control signal generating means 41 for generating a first control signal VC1 for controlling the motor drive circuit 36.

The first control signal generating means 41 includes a manually operable presetting variable resistor 42, a motor-driven variable resistor 43 which is operated by the motor 34 and an operational amplifier 47 having first and second inputs 44 and 45 and an output 46.

The presetting variable resistor 42 is connected at one end to the power supply line 31 and grounded at the other end. A movable contact of the presetting variable resistor 42 is connected via a resistor 48 to the second input 45 of the operational amplifier 47. Between the movable contact of the presetting variable resistor 42 and the ground is produced a signal of a voltage $V_p$ obtained by dividing the voltage $+V_B$ of the DC power source occurring between the power supply line 31 and the ground. The voltage $V_p$ has a value corresponding to the position of the movable contact of the presetting variable resistor 42. The signal of the voltage $V_p$ is supplied to the second input 45 of the operational amplifier 47.

The motor-driven variable resistor 43 has its movable contact mechanically coupled with the shaft of the motor 34 by means of a proper coupling mechanism 52. The motor-driven variable resistor 43 is connected at one end to the power supply line 31 and grounded at the other end. A movable contact of the variable resistor 43 is connected via a resistor 49 to the first input 44 of the operational amplifier 47. Between the movable contact of the motor-driven variable resistor 43 and the ground is developed a signal of a voltage $V_r$ obtained by dividing the voltage $+V_B$ of the DC power occurring between the power supply line 31 and the ground. The voltage $V_r$ has a value corresponding to the position of the movable contact of the motor-driven variable resistor 43. The signal of the voltage $V_r$ is fed to the first input 44 of the operational amplifier 47.

One of power terminals (not shown) of the operational amplifier 47 is connected to the power supply line 31 and the other is grounded. By the DC power obtained between the power supply line 31 and the ground, the operational amplifier 47 derives at its output 46, as the first control signal VC1, a signal of a voltage $V_c'$ corresponding to a difference voltage $V_c (=V_p-V_r)$ between the voltages $V_r$ and $V_p$ of the signals which are applied to the first and second inputs 44 and 45, respectively. A resistor 50 is connected between the second input 45 of the operational amplifier 47 and the ground and a negative feedback resistor 51 is connected between the output 46 and the input 45 of the operational amplifier 47.

The volume control apparatus 5 has first and second manually operable switching means 55 and 56, which are formed, for instance, by push-button switches 57 and 58.

The volume control apparatus 5 is further provided with control signal generating means 61 which selectively generates second and third control signals VC2 and VC3 for controlling the motor drive circuit 36.

The control signal generating means 61 includes a voltage divider 62 which is made operative by turning ON the push-button switch 57 forming the means 55, another voltage divider 63 which is made operative by turning ON the push-button switch 58 forming the means 56, and an operational amplifier 66 having third and fourth inputs 64a and 64b and an output 65.

The voltage divider 62 has series-connected resistors 67 and 68 and the series circuit is connected at one end to the power supply line 31 via a diode 69 and the push-button switch 57 and grounded at the other end and the connection point of the resistors 67 and 68 is connected to the input 64a of the operational amplifier 66. While the push-button switch 57 is in the ON state, there is derived at the connection point of the resistors 67 and 68 a signal of a voltage $V_a$ obtained by dividing the voltage $+V_B$ of the DC power occurring between the power supply line 31 and the ground. The signal of the voltage $V_a$ is applied to the input 64a of the operational amplifier 66.

The voltage divider 63 has series-connected resistors 70 and 71 and the series circuit is connected at one end to the power supply line 31 via a diode 72 and the push-button switch 58 and grounded at the other end. The connection point of the resistors 70 and 71 is connected to the input 64b of the operational amplifier 66. While the push-button 58 is held ON, there is developed at the connection point of the resistors 70 and 71 a signal of a voltage $V_b$ obtained by dividing the voltage $+V_B$ occurring between the power supply line 31 and the ground. The voltage $V_b$ can be made equal to that $V_a$ of the signal available from the voltage divider 62. The signal of the voltage $V_b$ is provided to the input 64b of the operational amplifier 66.

One of power terminals (not shown) of the operational amplifier 66 is connected to the power supply line 31 and the other is grounded at the other end. The operational amplifier 66 is made operative by the DC power occurring between the power supply line 31 and the ground. When supplied at its input 64a with the signal of the voltage $V_a$, the operational amplifier 66 derives at its output 65, as the second control signal VC2, a signal of a voltage $+V_a'$ which has the same polarity as the voltage $V_a$ of the input signal and has a value corresponding to the value of the voltage $V_a$. When supplied at its input 64b with the signal of the voltage $V_b$, the operational amplifier 66 derives at its output 65, as the third control signal VC3, a signal of a voltage $-V_b'$ which is reverse in polarity from the voltage $V_b$ of the input signal and has a value corresponding to the absolute value of the voltage $V_b$. Between the output 65 and the input 64b of the operational amplifier 66 is connected a negative feedback resistor 73.

The volume control apparatus 5 is further provided with control signal supply means 75 for supplying the motor drive circuit 36 with the first control signal VC1 available from means 41.

The control signal supply means 75 has a field effect type switching transistor 76, which is connected between the output of the control signal generating means 41 and the input 39 of the motor drive circuit 36 via a resistor 77, with either one of the source and drain of the transistor 76 connected to the output of the control signal generating means 41, that is, the output 46 of the operational amplifier 47 and the other connected to the input 39 of the motor drive circuit 36 via the resistor 77. To the control input or gate of the switching transistor 76 are selectively supplied from control signal generating means 81 fourth and sixth control signals VC4 and VC6 described later. When supplied with the fourth control signal VC4, the switching transistor 76 is made operative, that is, turned ON, supplying the first control signal VC1 to the input 39 of the motor drive circuit 36. When supplied with the sixth control signal VC6, the transistor 76 is made inoperative, i.e. turned OFF and does not provide the first control signal VC1 to the motor drive circuit 36.

The volume control apparatus 5 is further provided with control signal supply means 78 for supplying the input 39 of the motor drive circuit 36 and the second and third control signals VC2 and VC3 which are selectively derived from the control signal generating means 61. The control signal supply means 78 has a field effect type switching transistor 79 as is the case with the control signal supply means 75. The switching transistor 79 is connected between the output of the control signal generating means 61 and the input 39 of the motor drive circuit 36 via a resistor 80, either one of the source and drain of the switching transistor 79 being connected to the output of the control signal supply means 61, i.e. the output 65 of the operational amplifier 66 and the other being connected to the input 39 of the motor drive circuit 36 via the resistor 80. To the control input or gate of the switching transistor 79 are selectively applied from the control signal generating means 81 fifth and seventh control signals VC5 and VC7. When supplied with the seventh control signal VC7, the switching transistor 79 is made operative, that is, turned ON to supply the input 39 of the motor drive circuit 36 with the second or third control signal VC2 or VC3 when it is derived from the control signal supply means 61. When supplied with the fifth control signal VC5, the transistor 79 is made inoperative, that is, turned OFF and does not supply either of the second and third control signals VC2 and VC3 to the motor drive circuit 36.

The volume control apparatus 5 is further provided with control signal generating means 81 which generates fourth and fifth control signals VC4 and VC5 for controlling the control signal supply means 75 and 78 to be operative and inoperative, respectively, and generates sixth and seventh control signals VC6 and VC7 for controlling the control signal supply means 75 and 78 to be inoperative and operative, respectively.

The control signal generating means 81 comprises, for example, control signal generating circuits 82 and 83, and a flip-flop 88 having two inputs 84 and 85 and two outputs 86 and 87. The control signal generating circuit 82 generates an eight control signal VC8 for a predetermined period of time upon each application of the DC powers of the voltages $+V_B$ and $-V_B$ between the power supply lines 31 and 32 and the ground, respectively, and thereafter generates a ninth control signal VC9. The control signal generating circuit 83 generates a tenth control signal VC10 while either one of the first and second switching means 55 and 56 is operative and an eleventh control signal VC11 while they are inoperative. The flip-flop 88 selectively yields the fourth and fifth control signals VC4 and VC5 and the sixth and seventh control signals VC6 and VC7 in accordance with the control signals VC8 to VC11.

The control signal generating circuit 82 includes, for example, a bipolar NPN type switching transistor 89 and a bipolar PNP type switching transistor 90. The switching transistor 89 has its collector connected to the power supply line 31 via a solenoid coil 92 forming the relay 91 and a load resistor 94 and its emitter directly grounded. The relay 91 has the contact 93 for supplying the speaker 6 with the amplified sound signal S2 from the amplifier 3 described previously with regard to FIG. 1. Between the power supply line 31 and the ground is connected a charging capacitor 96 via a charging resistor 95. A series circuit of discharging resistors 97 and 98 is connected in parallel with the capacitor 96 and the connection point of the resistors 97 and 98 is connected to the base of the switching transistor 89. The resistors 95, 97 and 98 and the capacitor 96 constitute a time constant circuit 99. In the case of the DC power of the voltage $+V_B$ being applied between the power supply line 31 and the ground, there is provided at the connection point of the resistors 97 and 98 a control signal of a voltage high enough to turn ON the switching transistor 89 after the lapse of time determined by the time constant of the time constant circuit 99 since the abovesaid DC supply is started. The control signal is applied to the base of the switching transistor 89 to turn it ON. Then the DC power yielded across the power supply line 31 and the ground is fed via the resistor 94 and the switching transistor 89 to the solenoid coil 92 of the relay 91 to actuate it, making its contact 93.

The switching transistor 90 has its collector connected via a resistor 100 to the power supply line 32, its emitter connected directly to the power supply line 31 and its base connected to the collector of the switching transistor 89 via a resistor 101 and a diode 102. Upon turning ON of the switching transistor 89 as mentioned above, its collector assumes the ground potential. Then the switching transistor 90 is altered from the OFF state to the ON state and its collector potential changes from the negative potential of the power supply line 32 to the positive potential of the other power supply line 31. The negative and positive potentials are represented by "0" and "1" in the binary notation, respectively. In the predetermined time interval from the moment of the DC power supply between the power supply lines 31 and 32 and the ground to the moment of conduction of the switching transistor 90, the output "0" from its collector is the eighth control signal VC8 which is generated by the control signal generating circuit 82. The output "1" available from the collector of the transistor 90 from the moment of its conduction is the ninth control signal VC9 from the control signal generating circuit 82.

The control signal generating circuit 83 includes a bipolar NPN type switching transistor 103, which has its collector connected via a load resistor 104 to the power supply line 31, its emitter connected directly to the other power supply line 32 and its base connected via a resistor 105 to the power supply 32. A series circuit of resistors 106 and 107 is connected in parallel to the resistor 105 and the connection point of the resistors 106 and 107 is connected to the power supply line 31 via a diode 118 and the push-button switch 57 of the first switching means 55 and to the power supply line 31 via a diode 119 and the push-button switch 58 of the second switching means 56. In the case where the push-button switches 57 and 58 are selectively closed during the DC power supply to the power supply lines 31 and 32, there is obtained in the base of the switching transistor 103 a signal of a sufficient voltage to turn it ON, conducting the switching transistor 103. Upon turning ON of the transistor 103, its collector potential changes from the positive potential of the power supply line 31 to the negative potential of the other power supply line 32. These positive and negative potentials are represented by "1" and "0" in the binary notation, respectively. The output "0" available from the collector of the switching transistor 103 during its conduction is the tenth control signal VC10 from the control signal generating circuit 83. The output "1" available from the collector of the switching transistor 103 during its non-conduction is the eleventh control signal VC11 from the control signal generating circuit 83.

The flip-flop 88 includes two two-input NAND gates 108 and 109. One of the inputs of the NAND gate 108 is connected via the input 84 and a resistor 110 to the output of the control signal generating circuit 82, that is, the collector of the switching transistor 90, while the other input is connected to the output of the NAND gate 109. One of the inputs of the NAND gate 109 is connected via the input 85 to the output of the control signal generating circuit 83, that is, the collector of the switching transistor 103, while the other input is connected to the output of the NAND gate 108. When supplying from the control signal generating circuit 82 to the input 84 the eighth control signal VC8 which assumes the value "0" in the binary representation, outputs "1" and "0" are provided as the fourth and fifth control signals VC4 and VC5 from the outputs 86 and 87, respectively, so long as the eleventh control signal VC11 which assumes the value "1" in the binary representation is supplied from the control signal generating circuit 83 to the input 85. In the case where the tenth control signal VC10 taking the value "0" in the binary representation is applied to the input 85 from the control signal generating circuit 83, outputs which take the values "0" and "1" in the binary representation are obtained as the sixth and seventh control signals VC6 and VC7 from the outputs 86 and 87, respectively, so long as the ninth control signal VC9 assuming the value "1" in the binary representation are supplied from the control signal generating circuit 82 to the input 84. The fourth and sixth control signals VC4 and VC6 selectively available from the output 86 and applied via a diode 111 and a resistor 112 to the gate of the switching transistor 76 of the control signal supply means 75. The fifth and seventh control signals VC5 and VC7 selectively available from the output 87 is provided via diodes 113 and a resistor 114 to the gate of the switching transistor 79 of the control signal supply means 78. The switching transistor 76 is turned ON by the fourth control signal VC4 which assumes the value "1" in the binary representation and, at this time, the switching transistor 79 is turned OFF by the fifth control signal VC5 which takes the value "0" in the binary representation. In this case, even if the second or third control signal VC2 or VC3 is produced by the control signal generating means 61, it is not provided to the motor drive circuit 36 but the control signal VC1 from the first control signal generating means 41 is applied to the motor drive circuit 36. The switching transistor 79 is turned ON by the seventh control signal VC7 which assumes the value "1" in the binary representation and, at this time, the switching transistor 76 is turned OFF by the sixth control signal VC6 which takes the value "0" in the binary representation. In this case, the control signal VC1 from the first control signal generating means 41 is not supplied to the motor drive circuit 36 but if the second or third control signal VC2 or VC3 is yielded by the control signal generating means 61, it is applied to the motor drive circuit 36.

Moreover, the volume control apparatus 5 is provided with third switching means 115 which is manually operable and which is formed, for example, by a push-button switch 116.

The volume control apparatus 5 further includes control signal generating means 117 which generates twelfth and thirteenth control signals VC12 and VC13 for controlling the control signal supply means 75 and 78 to be operative and inoperative, respectively.

The control signal generating means 117 includes the flip-flop 88 constituting the aforementioned control signal generating means 81 and the push-button switch 116 forming the third switching means 115. The flip-flop 88 has its input 84 connected via the push-button switch 116 to the power supply line 31. When the push-button switch 116 is operated, the positive potential of the power supply line 31 is applied, as a fourteenth control signal VC14 assuming the value "1" in the binary representation, to the input 84 of the flip-flop 88. In such a case, there are available from the outputs 86 and 87 the outputs "1" and "0" as the twelfth and thirteenth control signals VC12 and VC13, respectively, so long as the eleventh control signal VC11 taking the value "1" in the binary representation is provided to the input 85. The twelfth and thirteenth control signals VC12 and VC13 thus obtained are applied to the switching transistors 76 and 79 of the control signal supply means 75 and 78 to turn ON the former and OFF the latter, respectively, supplying the control signal VC1 from the first control signal generating means 41 to the motor drive circuit 36.

The foregoing has described the arrangement of an embodiment of the volume control apparatus 5 of the present invention and the arrangement of an embodiment of the acoustic apparatus 1 employing it.

Figure 3:
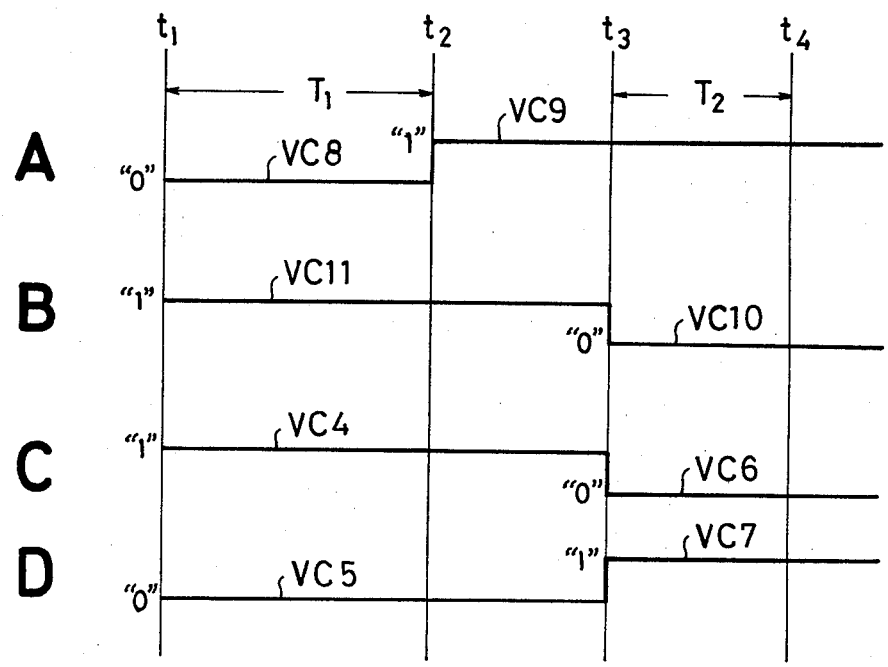
FIG. 3 is a signal waveform diagram explanatory of the operation of the volume control apparatus shown in FIG. 2.

According to the arrangement of the volume control apparatus 5 and the acoustic apparatus using it, if the timer switch 9 is turned ON at a moment $t_1$, then the DC powers of the voltages $+V_B$ and $-V_B$ are produced between the power supply lines 31 and 32 and the ground, respectively. As shown in FIG. 3A, the control signal VC8 is obtained from the control signal generating circuit 82 in the time interval $T_1$ between the moment $t_1$ and a moment $t_2$ which is determined by the time constant of the time constant circuit 99 of the control signal generating means 81 and, after the moment $t_2$, the control signal VC9 is derived from the control signal generating circuit 82. As long as neither of the push-button switches 57, 58 and 116 constituting the switching means 55, 56 and 115 is turned ON between the moments $t_1$ and $t_2$ and thereafter, the control signal VC11 is obtained from the control signal generating circuit 83 as depicted in FIG. 3B. In consequence, the control signals VC4 and VC5 are derived from the outputs 86 and 87 of the flip-flop 88 in the time interval between the moments $t_1$ and $t_2$ and after the moment $t_2$ as shown in FIGS. 3C and 3D, respectively.

Accordingly, in the time interval between the moments $t_1$ and $t_2$ and thereafter the control signal supply means 75 and 78 are turned ON and OFF, respectively. On the other hand, the control signal VC1 is produced by the control signal generating means 41 from the moment $t_1$ so that it is provided via the control signal supply means 75 to the motor drive circuit 36. Depending on whether the voltage Vc' of the control signal VC1 is positive or negative, the motor drive circuit 36 supplies the motor 34 with the DC power of the voltage $+V_B$ yielded between the power supply line 31 and the ground or the DC power of the voltage $-V_B$ produced between the power supply line 32 and the ground, driving the motor 34 in the forward or backward direction. By this, the volume control variable resistor 4 is adjusted in such a direction as to increase or decrease the loudness of a sound which is produced by the speaker 6, and the motor-driven variable resistor 43 is adjusted in such a direction that the voltage Vc' of the control signal VC1 is reduced to zero.

When the voltage Vc' of the control signal VC1 is reduced to zero, the motor drive circuit 36 does not supply the motor 34 with either of the DC powers produced between the power supply lines 31 and 32 and the ground, respectively. As a result of this, the motor 34 is stopped from rotation. At this time, the volume control variable resistor 4 is held at a position corresponding to the preset position of the presetting variable resistor 42. Such adjustment of the volume control variable resistor 4 comes to an end between the moments $t_1$ and $t_2$.

Where the control signal VC9 is yielded from the moment $t_2$, the relay 91 operates to close its contact 93. On the other hand, the sound signal S1 and the amplified sound signal S2 are yielded by the sound signal source 2 and the amplifier 3, respectively, from the moment $t_1$. Therefore, the amplified sound signal S2 is produced at an intensity corresponding to the preset position of the presetting variable resistor 42 from at least the moment $t_2$. Accordingly, the speaker 6 produces a sound of the loudness corresponding to the preset position of the presetting variable resistor 42 from the moment $t_2$.

Therefore, in the case where the acoustic apparatus 1 is used as an alarm or warming apparatus in combination with the timer switch 9, it is possible to obtain from the speaker 6 a sound of a loudness suitable as an alarm or warning after the moment $t_2$ by suitably presetting the presetting variable resistor 42.

In the case where the speaker 6 is producing a sound of the loudness corresponding to the preset position of the presetting variable resistor 42, if the push-button switch 57 or 58 is turned ON between moments $t_3$ and $t_4$ after the moment $t_2$, the control signal VC2 or VC3 is obtained from the control signal generating means 61 in the time interval $T_2$ between the moments $t_3$ and $t_4$. Further, even after the moment $t_4$ the control signal generating circuit 83 yields the control signal VC10 instead of VC11 as shown in FIG. 3B. As a result of this, the flip-flop 88 derives at its outputs 86 and 87 the control signals VC6 and VC7 in place of the signals VC4 and VC5 from the moment $t_3$ as depicted in FIGS. 3C and 3D, respectively.

Consequently, in the time interval between the moments $t_3$ and $t_4$ the control signal VC2 or VC3 from the control signal generating means 61 is provided via the control signal supply means 78 to the motor drive circuit 36. Then the motor drive circuit 36 applies the DC power of the voltage $+V_B$ or $-V_B$ to the motor 34 to drive it in the forward or backward direction, by which the volume control variable resistor 4 is adjusted to raise or lower the loudness of the sound which is produced by the speaker 6. In the period between the moments $t_3$ and $t_4$ the motor-driven variable resistor 43 is adjusted but, even after the moment $t_4$, the control signal generating circuit 82 keep on yielding the control signal VC9, so that the control signals VC6 and VC7 from the output 86 and 87 of the flip-flop 88 remain unchanged. As a result of this, the speaker 6 produces, from the moment $t_4$, a sound of the desired loudness corresponding to the position of the volume control variable resistor 4 adjusted in the period from the moment $t_3$ to $t_4$.

At an arbitrary moment even after the moment $t_4$, if the push-button switch 116 is closed, then the control signal VC14 is obtained, so that the control signals VC12 and VC13 are derived from the outputs 86 and 87 of the flip-flop 88 to turn ON and OFF the control signal supply means 75 and 78, respectively, thus supplying the control signal VC1 to the motor drive circuit 36 from the control signal generating means 41. By adjusting the presetting variable resistor 42 in such a state, the voltage $V_c'$ of the control signal VC1 varies from zero to a positive or negative value and, the motor drive circuit 36 applies the DC power of the voltage $+V_B$ or $-V_B$ to the motor 34 depending on whether the voltage $V_c'$ is positive or negative, thereby adjusting the volume control variable resistor 4 in the direction in which the loudness of the sound produced by the speaker 6 increases or decreases and adjusting the motor-driven variable resistor 43 in the direction in which the voltage $V_c'$ of the control signal VC1 is reduced to zero. Accordingly, the presetting variable resistor 42 can be preset to a desired position while listening to the sound produced by the speaker 6.

The foregoing should be construed as merely illustrative of the volume control apparatus of the present invention but not in a limiting sense and it will be apparent that many modifications and variations may be effected without departing from the scope of the novel concepts of the invention.

What is claimed is:

1. A volume control apparatus comprising:
   a manually operable presetting variable resistor;
   first and second selectively operable manual switching means;
   a motor for driving a volume control variable resistor;
   a motor drive circuit for driving the motor;
   a first means for generating a first control signal for controlling the motor drive circuit to drive the motor so that the volume control variable resistor may be set by the motor to a position corresponding to a preset position of the presetting variable resistor;
   a second means for generating a second control signal for controlling the motor drive circuit to drive the motor so that during a selective operation of the first switching means, the volume control variable resistor may be operated by the motor in a first direction in response to the selective operation of the first switching means, and for generating a third control signal for controlling the motor drive circuit to drive the motor so that during a selective operation of the second switching means, the volume control variable resistor may be operated in a second direction in response to the selective operation of the second switching means;
   a third means for supplying the motor drive circuit with the first control signal from the first means;
   a fourth means for selectively supplying the motor drive circuit with the second and third control signals from the second means; and
   a fifth means for generating fourth and fifth control signals for controlling, upon each a power supply, the third and fourth means to be operative and inoperative, respectively, in accordance with the power supplied, and for generating sixth and seventh control signals for controlling, after the power supply, the third and fourth means to be inoperative and operative, respectively, in accordance with the selective operation of the first and second switching means.

2. A volume control apparatus according to claim 1 wherein the first means includes a first operational amplifier having first and second inputs of reverse polarities and a variable resistor driven by the motor, and the presetting variable resistor and the motor-driven variable resistor constitute first and second voltage dividers, respectively, the outputs of the first and second voltage dividers being connected to the first and second inputs of the first operational amplifier, respectively;
   wherein the second means includes a second operational amplifier having third and fourth inputs of the reverse polarities and third and fourth voltage dividers operable by the selective operation of the first and second switching means, the outputs of the third and fourth voltage dividers being connected to the third and fourth inputs of the second operational amplifier, respectively;
   wherein the third means has a first switching element provided with a first control input and inserted between the output of the first operational amplifier and the input of the motor drive circuit;
   wherein the fourth means has a second switching element provided with a second control input and inserted between the output of the second operational amplifier and the input of the motor drive circuit; and
   wherein the fifth means has a flip-flop provided with fifth and sixth inputs and first and second outputs of reverse polarities, sixth means for generating an eighth control signal for a predetermined period of time upon each the power supply and generating for a predetermined period of time thereafter, a ninth control signal reverse in polarity from the eighth control signal, and a seventh means for generating a tenth control signal during the selective operation of the first and second switching means and an eleventh control signal while the first and second switching means are inoperative, the outputs of the sixth and seventh means being connected to the fifth and sixth inputs of the flip-flop, respectively, and the first and second outputs of the flip-flop being connected to the first and second control inputs of the first and second switching elements, respectively.

3. A volume control apparatus according to claim 1 further comprising a third selectively operable manual switching means and an eighth means responsive to the selective operation of the third switching means to generate twelfth and thirteenth control signals for controlling the third and fourth means to be operative and inoperative, respectively.

4. A volume control apparatus according to claim 2 which further comprises a third selectively operable manual switching means and an eighth means responsive to the selective operation of the third switching means to generate twelfth and thirteenth control signals for controlling the third and fourth means to be operative and inoperative, respectively, and wherein the eighth means is constituted by the third switching means and the flip-flop forming the fifth means, and the third switching means being connected to a fifth input of the flip-flop.

* * * * *